INVENTOR.
BERNARD L. KRAVITZ
BY
Shenier & O'Connor
ATTORNEYS

June 18, 1968 B. L. KRAVITZ 3,389,022

METHOD FOR PRODUCING SILICON CARBIDE LAYERS ON SILICON SUBSTRATES

Filed Sept. 17, 1965 2 Sheets-Sheet 2

INVENTOR.
BERNARD L. KRAVITZ
BY
Shenier & O'Connor
ATTORNEYS

United States Patent Office 3,389,022
Patented June 18, 1968

3,389,022
METHOD FOR PRODUCING SILICON CARBIDE LAYERS ON SILICON SUBSTRATES

Bernard L. Kravitz, Forest Hills, N.Y., assignor to United Aircraft Corporation, East Hartford, Conn., a corporation of Delaware Filed Sept. 17, 1965, Ser. No. 488,216
5 Claims. (Cl. 148—174)

My invention relates to the manufacture of silicon carbide semiconductor devices, and more particularly to a method of forming silicon carbide in planar semiconducting substrates.

Those skilled in the art have known for some time that silicon carbide has semiconducting characteristics that are advantageous in certain semiconductor devices, such as silicon carbide resistors. However, there is no commercially practicable method for preparing silicon carbide material so as to make it available for use in planar semiconductor devices. Large single crystals of silicon carbide which can be cut into wafers have been grown in laboratories but these so produced are expensive and, consequently, cannot be advantageously used commercially.

I have invented a new process for forming semiconducting silicon carbide in planar semiconducting substrates making possible the commercially practicable manufacture of a variety of silicon carbide semiconducting devices, especially silicon carbide components for integrated circuits.

One object of my invention is to provide a new method for forming semiconducting silicon carbide in planar semiconducting substrates.

Another object of my invention is to provide a new method for forming semiconducting silicon carbide in which the doping of the silicon carbide can be controlled.

An additional object of my invention is to provide a new method for forming silicon carbide semiconductors in which the silicon carbide can be of the n-type conductivity or of the p-type conductivity.

Still another object of my invention is to provide a method for manufacturing silicon carbide semiconductor material which permits commercially practicable manufacture of integrated circuits employing silicon carbide.

A further object of my invention is to provide a method for forming silicon carbide in discrete regions of a semiconductor substrate, which regions can be of small dimension if desired, for example on the order of one mil.

Other and further objects of my invention will appear from the following description.

In general my invention contemplates the provision of a new process for forming silicon carbide semiconductive devices in which I deposit elemental carbon in discrete regions on the surface of a semiconducting wafer which may be cut from a single crystal of silicon. I then heat the wafer and the deposited carbon to a temperature at which they chemically react to form regions of silicon carbide in the wafer.

In the accompanying drawings which form part of the instant specification, and which are to be read in conjunction therewith and in which like reference numerals are used to indicate like parts in the various views.

Figures 1, 2, 3, 4:
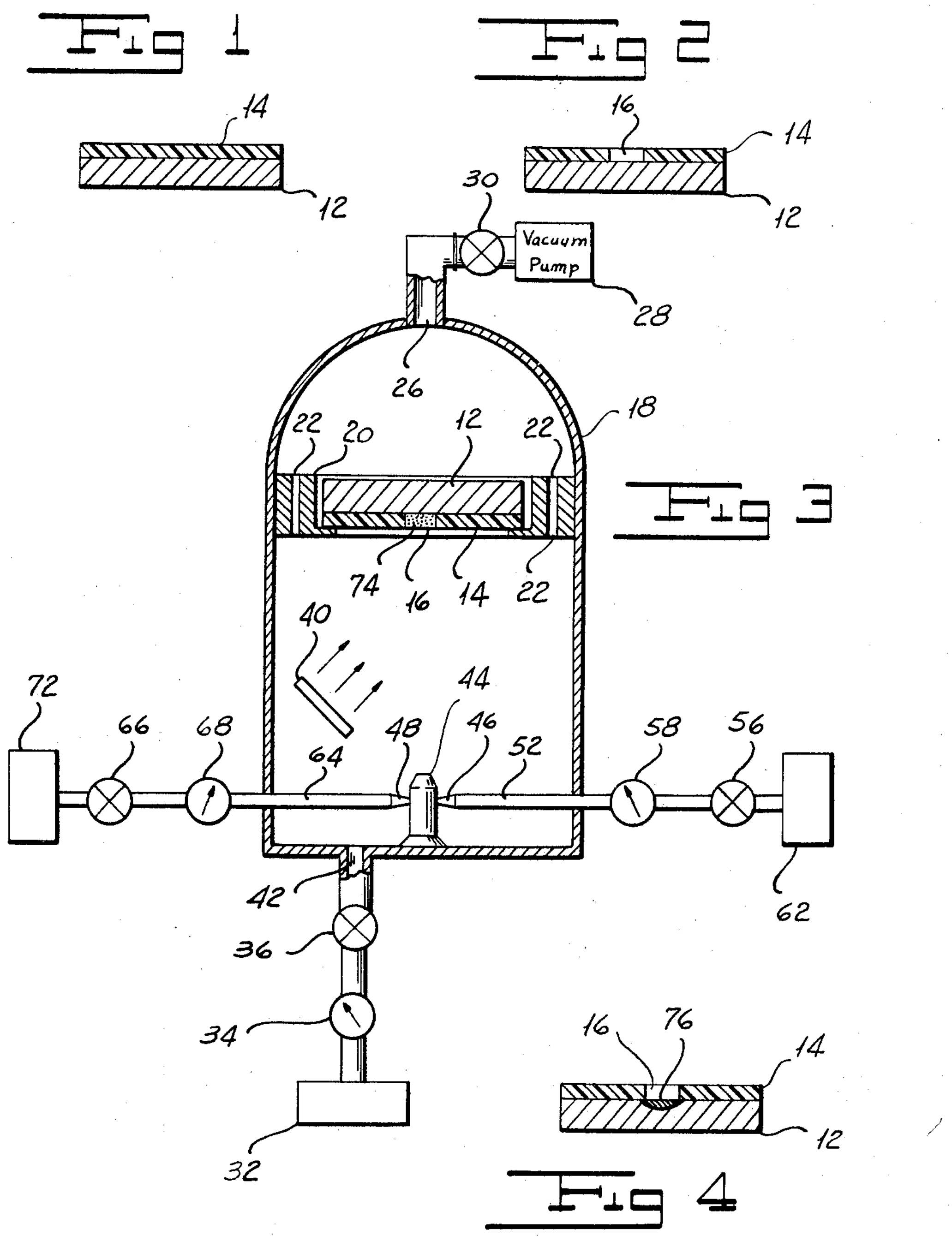
FIGURE 1 is a sectional view of a silicon wafer with a masking coating on one of its surfaces.
FIGURE 2 is a sectional view of the wafer shown in FIGURE 1, showing an opening in the masking coating.
FIGURE 3 is a diagrammatic view of apparatus, with parts in section, capable of carrying out one embodiment of my process for forming silicon carbide.
FIGURE 4 is a sectional view of the wafer shown in FIGURES 1 and 2, showing a discrete region of silicon carbide formed therein.

More particularly, referring now to FIGURE 1 of the drawings, one surface of a wafer 12 cut from a single crystal of silicon is covered with a masking coating 14 of silicon dioxide or other suitable masking material known in the art. A silicon dioxide coating is conveniently formed by heating the silicon wafer 12 in an atmosphere of moisture and air. I expose a region of the surface of the wafer 12 by forming an opening 16 in the mask 14 by use of the photo-resist process or other suitable method known to the art. Details of the photo-resist technique are described at page 277 of "Miniature and Microminiature Electronics" by Dummer and Granville, published in 1961 by John Wiley & Sons, New York.

After forming the opening 16 I position the wafer 12 in a hermetic chamber 18 on a bracket 20 which has a plurality of passageways 22 extending therethrough. A valve 30 connects a vacuum pump 28 to a port 26 in the top of chamber 18. I connect a meter 34 and a flow control valve 36 in series between a container 32 and a port 42 in the bottom of chamber 18.

In the chamber 18, I position a burner 44 which has two feed nozzles 46 and 48. A tube 52 connects nozzle 46 through a valve 56 and a meter 58 to a container 62. A tube 64 connects nozzle 48 through a valve 66 and a meter 68 to a container 72 which may advantageously contain a liquid hydrocarbon under pressure such as benzol, toluol, hexylene, xylene, or the like. It will be understood I may employ any other suitable hydrocarbon or mixture of hydrocarbons which will produce a carbon deposit when burned under proper conditions, such as aliphatic, olefinic or aromatic liquid or gaseous hydrocarbons. Container 62 contains a suitable oxidizing agent such as oxygen under pressure for partially burning the hydrocarbon.

Preferably, I exhaust the chamber 18 by means of pump 28 and maintain a vacuum therein to prevent oxidation of the surface exposed by opening 16 and to prevent contamination of the carbon layer to be formed by foreign elements that would be detrimental to the semiconducting properties of the silicon carbide to be formed. Alternatively, I may flood the chamber 18 with an inert gas, such as argon, which may be supplied from container 32, if desired.

After the chamber has been evacuated or filled with an inert gas, I open valves 56 and 66 and feed the hydrocarbon and oxygen to burner 44 from containers 72 and 62 respectively. I control the rate at which each material reaches burner 44 by means of valves 66 and 56 respectively. The hydrocarbon such as for example xylene, at a predetermined temperature reacting with insufficient oxygen for complete combustion deposits a uniform, continuous, adherent layer of carbon on all exposed surfaces within the chamber. The exposed surface 14 and the opening 16 will be covered with a carbon layer. When the wafer is removed the excess carbon can be removed from the surface of masking coating 14, leaving a deposit of carbon 74 in the opening 16. The drawing, for purposes of clarity, does not show the excess carbon deposit. I may provide heaters (not shown) to bring the materials fed to the burner to a predetermined temperature to promote partial combustion. The burner 44 is equipped with an ignition means such as a spark gap (not shown).

Vacuum pump 28 advantageously operates continuously and withdraws from the chamber those vapors which are not deposited on the wafer. After a layer 74 of carbon of suitable thickness (about 5 to 10 mils) has been deposited I close valves 56 and 66. The thickness of the layer can be determined with sufficient accuracy by exposing the wafer to the combustion products for a predetermined period of time.

I then heat wafer 12 to a reaction temperature of around 1300° C. to cause the carbon 74 and wafer 12 to chemically react and form a region of silicon carbide 76, as shown in FIGURE 4. To perform the heating step I may remove the wafer 12 from the chamber 18 and place it in a suitable oven for heating it to the required temperature around 1300° C. Alternatively, I may heat the wafer while in the chamber 18 by means of a suitable heater such as the radiant heater indicated schematically at 40. In such case, it will be understood the chamber and support are formed of refractory material. I carefully control the environment in which the wafer 12 is heated while silicon carbide forms to prevent undesired doping or contamination of the silicon carbide material by conducting the process in a vacuum or in a suitable inert gas.

The silicon carbide region 76 extends below the surface of the silicon wafer 12, as indicated in FIGURE 4 to a depth which depends principally on the temperature to which the wafer is heated and upon the period of time this temperature is maintained.

If the silicon wafer adjacent the region 16 contains donor or acceptor impurities making it n-type or p-type silicon respectively, the silicon carbide which forms in the region will also be n-type or p-type silicon carbide respectively.

I can also make the conductivity of the silicon carbide region 76 n-type or p-type by adding a small quantity of dopant to the atmosphere while the silicon carbide is forming. Nitrogen and phosphorus are examples of n-type dopants, and boron and aluminum are examples of p-type dopants. It is possible to use compounds such as $Na_3PO_4$, $Al_2O_3$ and $P_2O_3$ as sources of these impurities since these compounds are sufficiently volatile at the temperatures employed. If the wafer is heated in the chamber 18 the dopants can be supplied from a container such as container 32 if desired.

The process which I have thus far described is especially well suited for forming discrete regions of silicon carbide. Carbon deposited by my new method will penetrate an opening in the masking coating 14 of a dimension of the order of one mil and will form a silicon carbide region of comparable dimension.

Figures 5, 6, 7, 8, 9, 10, 11:
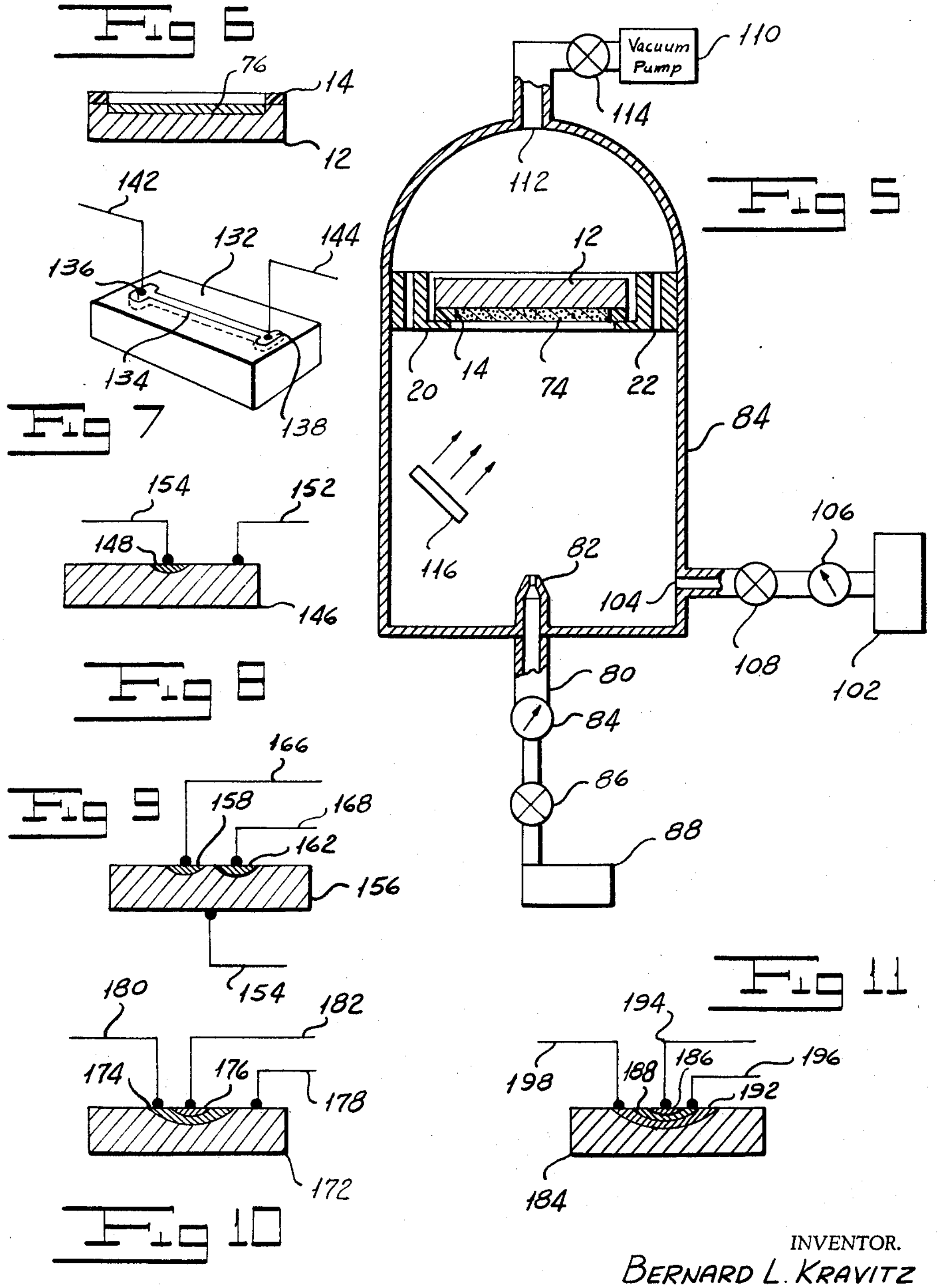
FIGURE 5 is a diagrammatic view of apparatus, with parts in section, capable of carrying out another embodiment of my process for forming silicon carbide.
FIGURE 6 is a sectional view of a silicon wafer which has an extensive region of silicon carbide formed therein.
FIGURE 7 is a perspective view of a silicon carbide resistor formed by my process.
FIGURE 8 is a sectional view showing a diode formed with a silicon carbide region.
FIGURE 9 is a sectional view showing a transistor having a silicon carbide region.
FIGURE 10 is a sectional view of a transistor having silicon carbide regions.
FIGURE 11 is a sectional view of a transistor similar to that shown in FIGURE 10 but having an additional silicon carbide region.

Cracking a hydrocarbon on the surface of the wafer 12 is another method suitable for depositing a carbon layer for forming silicon carbide. Referring to FIGURE 5, apparatus for practicing this embodiment of my invention includes a nozzle 82 directed at the surface of wafer 12 which is positioned by frame 22 in a hermetic chamber 84 of a suitable refractory material. A tube 80 supplies a hydrocarbon from a container 88 to a nozzle 82 through a meter 84 and a valve 86. The meters shown in the drawings enable me to regulate the fluid flow by adjusting the associated valves. Meter 106 and a flow control valve 108 in series are positioned between a container 102 and a port 104 in the chamber 84. A valve 114 connects a vacuum pump 110 to a port 112 in the wall of chamber 84. A suitable heater such as a focused radiant heater indicated schematically at 116 heats the surface of wafer 12 to the cracking temperature of the hydrocarbon used (about 900° C. for methane for example). Pump 110 preferably maintains a vacuum in chamber 84 during the cracking step to prevent oxidation and contamination of the surface of wafer 12.

After exhausting chamber 84 and heating the surface of wafer 12 to an elevated temperature sufficient to crack an impinging hydrocarbon I open valve 86 to permit nozzle 82 to direct the hydrocarbon from the container 88 onto the heated surface of the wafer. The hydrocarbon cracks and deposits a layer 122 of elemental carbon on the heated surface of the water 12. After a carbon layer 122 about 5 to 10 mils in thickness forms I close valve 86 to shut off the flow of hydrocarbon gas. The thickness of the layer may be accurately determined by timing the duration of the cracking step.

The remaining steps for forming silicon carbide and controlling its conductivity type are the same as I have heretofore described in connection with FIGURE 3, namely, I heat the wafer 12 with the deposited carbon to a temperature of above 1300° C., preferably in a vacuum or in an inert atmosphere. The silicon and carbon chemically react and form a region of silicon carbide 120 as shown in FIGURE 6. The wafer may be doped prior to depositing carbon, or the silicon carbide may be doped as it forms. If the silicon and carbon are reacted in the chamber 84, container 102 is available for supplying a suitable dopant environment.

Another method for depositing elemental carbon on the surface of a silicon wafer is to cover the masked surface of the wafer with a volatile liquid such as ethyl alcohol in which finely divided carbon particles are suspended. The alcohol evaporates and deposits a layer of carbon on the unmasked surface regions of the wafer. Heating the wafer above 1300° C. in the manner described above forms silicon carbide.

FIGURE 7 shows a silicon carbide resistor formed by depositing elemental carbon in a thin narrow strip with an enlarged region at each end on the surface of a silicon substrate 132. Subsequently heating the substrate 132 above 1300° C. forms a narrow strip of silicon carbide 134 with enlarged ends 136 and 138 to which leads 142 and 144 are ohmically connected. It will be appreciated by those skilled in the art that silicon carbide resistors formed similarly to that shown in FIGURE 7 may have a high resistance per unit of length and are well suited for use in integrated circuits.

FIGURE 8 shows a heterogeneous diode comprising a silcon substrate 146 with a silicon carbide region 148 formed in it. The silicon wafer 146 may be n-type silicon, for example, in which case the silicon carbide region 148 would be p-type silicon carbide formed, for example, by depositing carbon in the region 148 and subsequently heating it in a dopant atmosphere of boron or aluminum. Leads 152 and 154 make ohmic contact with the silicon wafer 146 and silicon carbide region 148 respectively.

FIGURE 9 shows a heterogeneous silicon-silicon carbide transistor comprising a wafer of silicon 156, which forms the base of the transistor, and two adjacent silicon carbide regions 158 and 162 formed in it. The wafer 156 may be p-type silicon, for example, in which case the regions 158 and 162 would be n-type silicon carbide, which can be conveniently formed by depositing carbon in the discrete regions 158 and 162 and subsequently heating the wafer to 1300° C. in a dopant atmosphere of phosphorus. Leads 164, 166 and 168 make ohmic contact with the wafer 156 and the regions 158 and 162 respectively.

FIGURE 10 shows another heterogeneous silicon-silicon carbide transistor comprising a silicon wafer 172 with two nested silicon carbide regions 174 and 176 formed in it. Wafer 172 forms the collector, region 174 is the base, and region 176 is the emitter. The collector 172 may be n-type silicon for example, in which case the base 174 would be p-type silicon carbide and the emitter 176 would be n-type silicon carbide. The regions 174 and 176 can conveniently be formed by forming silicon carbide in a p-type region formed in silicon wafer 172, subsequently masking a portion of the p-type silicon carbide region and then diffusing an n-type dopant into it to form region 176. A collector lead 178, a base lead 180, and an emitter lead 182 make ohmic contact with the regions 172, 174 and 176 respectively.

FIGURE 11 shows a silicon carbide transistor formed in a wafer of silicon 184. The transistor comprises a silicon carbide emitter 186, a silicon carbide base 188, and a silicon carbide collector 192. The emitter may be n-type silicon carbide, the base p-type silicon carbide, and the collector n-type silicon carbide for example, formed similarly to the transistor shown in FIGURE 10, but including one additional diffusion step for the collector 192. Leads 194, 196 and 198 make ohmic contact with the emitter, base and collector respectively.

Thus it will be appreciated that I have accomplished the objects of my invention. I have provided a novel method for forming silicon carbide semiconductor devices in a simple, convenient, and accurately controlled manner. The silicon carbide semiconductor devices formed by my new method may be planar and are well suited for synthesizing integrated circuits. With my new method I can form silicon carbide in predetermined discrete regions of a silicon substrate. These regions may be small enough to enable incorporation into integrated circuits.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is therefore to be understood that my invention is not to be limited to the specific details shown and described.

Having thus described my invention, what I claim is:

1. A method of forming a semiconductor device including the steps of partially oxidizing a hydrocarbon material to form elemental carbon, depositing the carbon through an opening formed in a mask onto the surface of a semiconducting silicon crystal, providing an environment which includes a predetermined amount of selected dopant material adjacent said surface, and heating the deposited carbon and the silicon crystal to 1300° C. to form silicon carbide.

2. A method of forming a semiconductor device including the steps of partially oxidizing a hydrocarbon material forming elemental carbon as a combustion product, depositing the elemental carbon on the surface of a semiconducting silicon crystal, providing an environment which includes a predetermined amount of selected dopant material around said crystal, and then heating the deposited carbon and the silicon crystal to 1300° C. to form silicon carbide.

3. A method of forming a semiconducting device including the steps of depositing an adherent layer of carbon on the surface of a semiconducting silicon crystal, maintaining an environment during the depositing step which includes a predetermined amount of selected dopant material, and then heating said carbon and said silicon crystal to an elevated temperature at which said silicon and said carbon react to form silicon carbide.

4. A method of forming a semiconducting device including the steps of depositing carbon on the surface of a semiconducting silicon crystal, maintaining the crystal in an environment free of contaminants and then heating said carbon and said crystal to an elevated temperature at which the silicon and carbon react to form silicon carbide.

5. A method of forming a semiconducting device including the steps of depositing carbon over a predetermined discrete area on a surface of semiconducting silicon crystal, and heating the carbon and the silicon to an elevated temperature at which the silicon and carbon react to form silicon carbide in the region of said area.

References Cited

UNITED STATES PATENTS

| | | | |
|---|---|---|---|
| 3,025,192 | 3/1962 | Lowe ---------- | 148—174 XR |
| 3,147,159 | 9/1964 | Lowe ---------- | 148—175 XR |
| 3,340,110 | 9/1967 | Grabmaier et al. -- | 148—174 XR |

HYLAND DIZOT, *Primary Examiner.*

P. WEINSTEIN, *Assistant Examiner.*